United States Patent
Yasar et al.

(10) Patent No.: US 6,755,945 B2
(45) Date of Patent: Jun. 29, 2004

(54) IONIZED PVD WITH SEQUENTIAL DEPOSITION AND ETCHING

(75) Inventors: Tugrul Yasar, Scottsdale, AZ (US); Glyn Reynolds, Las Vegas, NV (US); Frank Cerio, Phoenix, AZ (US); Bruce Gittleman, Scottsdale, AZ (US); Michael Grapperhaus, Lowell, MA (US); Rodney Robison, Mesa, AZ (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 10/138,049

(22) Filed: May 3, 2002

(65) Prior Publication Data

US 2003/0034244 A1 Feb. 20, 2003

Related U.S. Application Data (60) Provisional application No. 60/288,952, filed on May 4, 2001.

(51) Int. Cl.[7] .............................................. C23C 14/34
(52) U.S. Cl. .............................. 204/192.3; 204/192.17; 204/298.06; 204/298.28
(58) Field of Search ......................... 204/192.3, 192.17, 204/298.06, 298.28

(56) References Cited

U.S. PATENT DOCUMENTS

| | | | | |
|---|---|---|---|---|
| 4,664,935 A | * | 5/1987 | Strahl ..................... | 204/298.28 |
| 4,999,096 A | * | 3/1991 | Nihei et al. .............. | 204/192.3 |
| 5,658,438 A | * | 8/1997 | Givens et al. ........ | 204/192.11 |
| 6,100,200 A | | 8/2000 | Van Buskirk et al. ...... | 438/697 |
| 6,106,677 A | | 8/2000 | Sandhu .................... | 204/192.3 |
| 6,132,564 A | | 10/2000 | Licata .................... | 204/192.15 |
| 6,197,167 B1 | * | 3/2001 | Tanaka .................. | 204/192.15 |
| 6,274,008 B1 | | 8/2001 | Gopalraja et al. ..... | 204/192.17 |
| 6,475,356 B1 | * | 11/2002 | Ngan et al. ............ | 204/192.17 |

FOREIGN PATENT DOCUMENTS

| WO | WO 99/57746 | * 11/1999 |
|---|---|---|
| WO | WO 00/05745 | 2/2000 |
| WO | WO 00/07236 | 2/2000 |

\* cited by examiner

Primary Examiner—Rodney G. McDonald
(74) Attorney, Agent, or Firm—Wood, Herron & Evans, L.L.P.

(57) ABSTRACT

An iPVD apparatus (20) is programmed to deposit material (10) into high aspect ratio submicron features (11) on semiconductor substrates (21) by cycling between deposition and etch modes within a vacuum chamber (30). The modes operate at different power and pressure parameters. Pressure of more than 50 mTorr, for example, is used for sputtering material from a target while pressure of less than a few mTorr, for example, is used to etch. Bias power on the substrate is an order of magnitude higher for etching, producing several hundred volt bias for etching, but only a few tens of volts for deposition. The alternating etching modes remove deposited material that overhangs edges of features on the substrate, removes some of the deposited material from the bottoms (15) of the features, and resputters the removed deposited material onto sidewalls (16) of the features. The substrate (21) is cooled during deposition and etching, and particularly during etching to substantially below 0° C. RF energy is coupled into the chamber (30) to form a high density plasma, with substantially higher RF power coupled during deposition than during etching. The substrate (21) is moved closer to the plasma source during etching than during deposition.

43 Claims, 8 Drawing Sheets

IONIZED PVD WITH SEQUENTIAL DEPOSITION AND ETCHING

This application claims priority to U.S. Provisional Patent Application Serial No. 60/288,952, filed May 4, 2001, hereby expressly incorporated herein by reference.

FIELD OF THE INVENTION

This invention relates to the metallization of via and trench structures on semiconductor wafers. More particularly, the invention relates to the metallization of high aspect ratio via and trench structures of silicon wafers utilizing ionized sputtered materials to form the barrier and seed layers.

BACKGROUND OF THE INVENTION

In the metallization of high aspect ratio via holes and trenches on semiconductor wafers it is required that the barrier layer and the seed layer have good sidewall and bottom coverage. The barrier layer needs to be as thin as possible without sacrificing its barrier properties. The barrier layer must be thin because its electrical resistance, which adds to the electrical resistance of the via structure, must be minimized. It needs to be conformal and continuous to prevent diffusion of seed layer material into the dielectric layer and into other layers to prevent reliability problems. This requires that the barrier layer thickness must be well controlled and minimized especially at the bottom of the via. A thick barrier layer at the bottom of the via may add substantial undesirable electrical resistance to the resistance of interconnect metallization. High contact resistance results in inferior IC performance. During barrier layer deposition, at the top edges of the via's entrance, an overhang may form due to buildup of thicker material there. This overhang interferes with the deposition of the seed layer onto the sidewalls and the bottom of the via. During seed layer deposition, further overhang formation by the seed layer material itself must be prevented.

The seed layer must be continuous and have good coverage at the sidewalls and at the bottom of the vias. This is essential for the electroplating step which follows the barrier and seed layer deposition. The closure of the via entrance by overhang results in poor sidewall coverage, poor electroplated fill and low device yields.

Ionized PVD deposition is used for barrier and seed layer metallization in advanced IC wafers. Ionized PVD provides good sidewall and bottom coverage in via and trench structures. However, as the geometries shrink and as the via dimensions go down below 0.15 micrometers, ionized deposition requirements become more critical. Therefore, it is highly desirable to have an ionized PVD process where bottom and sidewall coverage are well balanced and overhang is minimized.

Sequential deposition and etch processes have been proposed previously. In U.S. Pat. No. 6,100,200, Van Buskirk, et al., teach a sequentially performed heated deposition and etch unit process to provide conformal coverage of via or trench structures. However, they teach deposition and etch processes at high substrate temperatures between 300°–600° C. and 500°–450° C. typically. Unfortunately, the new state-of-the-art low-k dielectrics that are used in current semiconductor processes require temperatures <200° C. Cu seed layer deposition requires <0° C., typically −20° C. to −50° C. to prevent copper agglomeration. The temperatures taught by Van Buskirk, et al., would result in total agglomeration of Cu seed layers, overhang and closure of via and trenches with large islands of Cu and discontinuous Cu layers. Van Buskirk, et al., also teaches low power sputtering typically less than 1 kW and particularly less than 0.5 kW. This puts severe deposition rate and throughput limitations on the process.

Furthermore, Van Buskirk, et al., teach sequential deposition and etching steps to be carried out in a singular vacuum system by transporting the wafer between dedicated deposition and etch modules, or in a singular vacuum system using a multi-faceted deposition and reactive ion etch module. Alternatively, Van Buskirk et al. suggests the steps may be carried out in independent deposition and etch systems. Transferring the wafer from one etch chamber to another deposition chamber or from an etch station to another deposition station within the same module has disadvantages both from cost of process and quality of process points of view. By transferring wafers from chamber to chamber or from one station to another station in the same chamber, loss of throughput results, and thus a more costly process. Some processes are sensitive to adsorption of gas molecules or other contaminants during transfer, which may be detrimental to the quality and reliability of the devices under construction. Another suggestion of Van Buskirk, et al., is to carry out the deposition and etch steps in independent systems with exposure to atmosphere in between processes, is totally unacceptable in most of the modern barrier/seed layer metallization processes. Van Buskirk, et al., also do not teach any substrate bias during the deposition step.

In U.S. Pat. No. 4,999,096, Nikei, et al., teach a method of and apparatus for sputtering when sequential deposition and etching in the same chamber can be performed. Nikei, et al., applies a negative voltage alternatively to a target and a substrate to perform film deposition and reverse sputter alternately. They teach an RF coil internal to the process module, situated between the target and substrate, to cause plasma generation for the etch step. This configuration has a significant disadvantage in that the internal coil is a source of contamination because it is well known in the art that energetic ions and neutrals that exist in the process space will also remove material from, i.e., etch, the coils and contaminate the film being deposited or etched on the substrate. In other prior art, the coil can be made from the same material that is being deposited, but this creates undue economic and hardware difficulties for the process. Not every material to be deposited is amenable to construct a coil and most of the time the cost is prohibitive. Furthermore, the suggestions of Nikei, et al., will result in non-uniform plasma generation and non-uniform etching of the substrate. It is essential in a sequential etching and deposition process that both steps be uniform across the wafer to result in a uniformly processed wafer at the end of the process.

Nikei, et al., strictly teach and emphasize a low pressure deposition and etching process to prevent impurity inclusion in the deposited films. This is achieved by creating the plasma at low pressure, such as on the order of $10^{-3}$ torr or less during the etch and deposition process. During the etch process the internal coil needs to be RF powered to achieve a discharge which, contrary to their desire to keep certain contaminants from the substrate, now contributes contaminants to the substrate. Nikei, et al., strictly teach or limit their invention to low pressure ($10^{-3}$ torr or less) operation.

U.S. Pat. No. 6,274,008 teaches an integrated copper fill process where a simultaneous clean-deposit step is carried out. This invention uses copper ions to clean and/or etch the bottom of via structures before the copper seed layer is deposited.

SUMMARY OF THE INVENTION

According to principles of the present invention, a process and an apparatus are provided wherein sequential deposition and etching steps are used to solve the problems set forth above. The process of the invention involves first depositing a thin layer of metallization, for example, tantalum (Ta), tantalum nitride (TaN) or copper (Cu), and then, preferably after stopping the deposition, performing an ion etch step, preferably by ionized gas, for example, argon (Ar).

The etching step removes less material on both the field area on the top surface of the wafer and the via bottom than is deposited during the deposition step, and thus there is net deposition at the end of the process cycle. The deposition/etch cycle can be repeated as many times as needed to achieve the desired result. By balancing the deposition and etching times, rates and other deposition and etch parameters, the overhang growth is eliminated or minimized. The overhang and bottom deposition is etched back and redistributed at least partially to the sidewalls.

In the process according to one embodiment of the invention, material is deposited onto a wafer having small high aspect ratio features, for example, holes or vias of diameters of 0.15 micrometers or less with aspect ratios of from three or five, to fifteen or higher. The deposition uses an ionized physical vapor deposition (iPVD) process and apparatus having the features as described in U.S. Pat. Nos. 6,287,435, 6,080,287, 6,197,165, 6,132,564, 5,948,215 and 5,800,688, and PCT application PCT/US00/31756 based at least in part thereon, all hereby expressly incorporated by reference herein.

One embodiment of the invention utilizes the unique advantages of the ionized PVD apparatus as described in more detail in connection with FIG. 1 of U.S. Pat. No. 6,287,435 and PCT application PCT/US00/31756 referred to above. This apparatus is particularly well suited for the sequential deposition and etching process. The sequential deposition and etching process can be applied to a substrate in the same process chamber without breaking vacuum or moving the wafer from chamber to chamber. The configuration of the apparatus allows rapid change from ionized PVD deposition mode to etching mode or from etching mode to ionized PVD deposition mode. The configuration of the apparatus also allows for instantaneous optimization of ionized PVD deposition process control parameters during deposition mode and etching process control parameters during etching mode. The consequence of these advantages is a high throughput of wafers with superior via metallization and subsequent electroplated fill operation.

The invention, in addition to teaching low substrate temperature, proposes high DC target power, for example 8 kW to 19 kW, typically 11 kW. The high power levels not only result in a high throughput process but also optimize the ionization and ionized deposition of the metallic species, such as Cu or Ta.

The invention solves problems of the prior art by providing the sequential etch and deposition steps in situ in the same chamber with high throughput and without interfacial layers that may develop in the processes taught by Van Buskirk, et al.

The configuration of the process module provided by the present invention accommodates a wide range of pressures to result in conformal via and trench coverage at high wafer throughput levels. The invention does not have the low pressure limitations of Nikei, et al., and provides process pressure levels optimized for sputtering and etching steps of the process utilizing capabilities of the apparatus. Furthermore, the prior art does not teach a deposition-etch cycle with optimized source-to-substrate distance for each step to increase the uniformity of the resulting films.

U.S. Pat. No. 6,274,008 does not teach a sequential etch and deposit scheme and is limited to metal ions as the cleaning species.

These and other objects and advantages of the present invention will be more readily apparent from the following detailed description of illustrated embodiments of the invention.

DETAILED DESCRIPTION OF THE ILLUSTRATED EMBODIMENTS OF THE INVENTION

Figure 1:
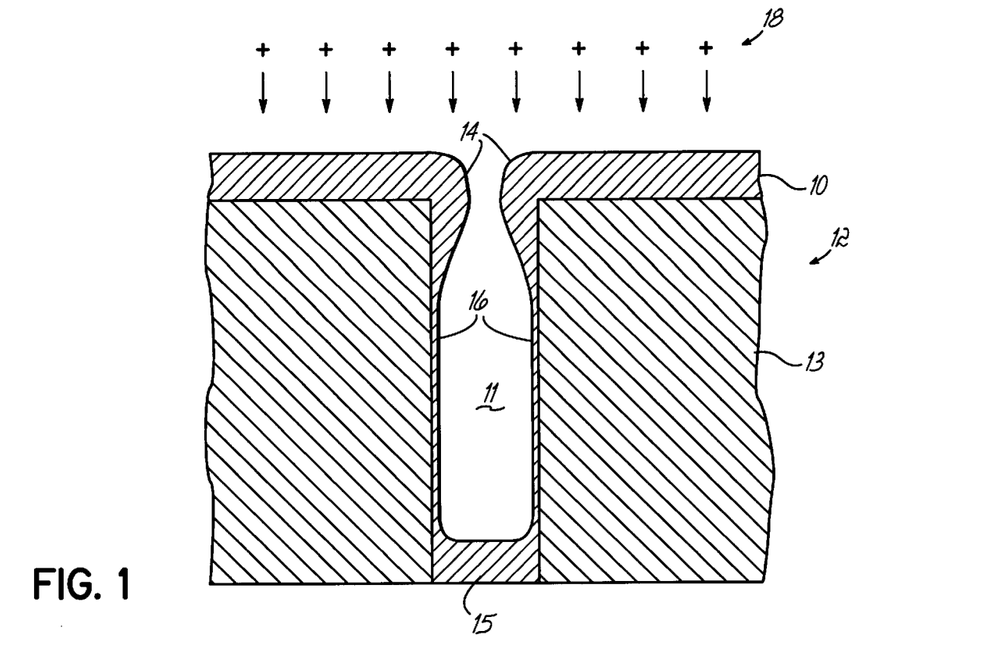
FIG. 1 is a diagram of the cross-section of a portion of a semiconductor wafer showing the mechanism involved in metal deposition by iPVD.

FIG. 1 depicts the deposition of a metal film 10 into via structure 11 formed in a dielectric interlayer 13 of a semiconductor wafer 12 by iPVD. As metal ions 18 are deposited onto the wafer 12, the metal deposition has a propensity to become thicker at the via entrance causing an overhang structure 14. Similarly, the deposition of metal at the bottom 15 of the via 11 becomes thicker than at the sidewalls 16. As via dimensions decrease to below 0.15 micrometers with no corresponding reduction in the thickness of the dielectric interlayer 13, the aspect ratio of the via 11 will have increased significantly, limiting the flux of metal ions 14 onto the sidewalls 16 of the via 11. For thin deposits of less than 100 Å, the film deposited on the sidewalls 16 of the via 11, especially for a seed layer of a metal such as copper, tends to have an agglomerated island structure. Gaps and discontinuities in a copper seed layer can lead to plating voids on the sidewalls 16, particularly at the bottom of a sidewall, where the metal coverage is the least.

Figure 2:
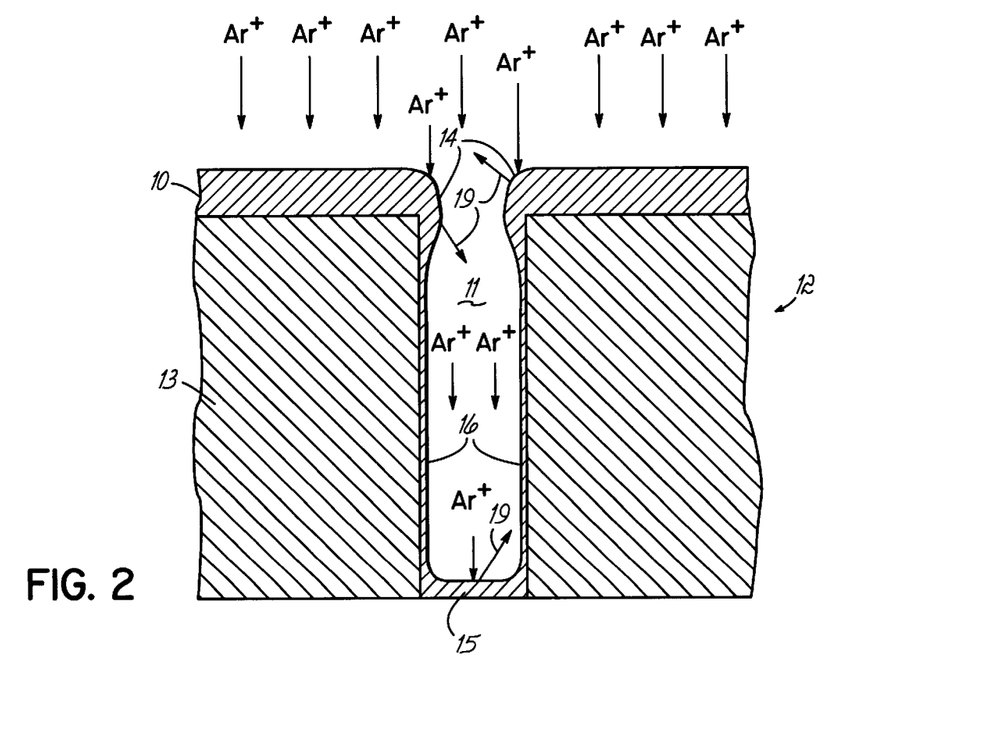
FIG. 2 is a diagram of the cross-section of the portion of a semiconductor wafer of FIG. 1 showing the mechanism involved in the resputtering by etching of the deposited metal.

FIG. 2 diagrammatically illustrates an etch cycle to re-sputter the metal deposition 10 from the bottom 16 of the via 11 and from the overhang structure 14 at the top of the via 11. In an etch cycle, argon ions (Ar+) strike and sputter material from the deposited layer 10 as indicated by the arrows 19. This sputtering removes excess material from the via bottom 16 and from the overhangs 14. When the metal layer is copper, the etch process increases the continuity of the Cu on the bottom 16 and top portions of the sidewall 16 by redeposition of Cu sputtered from the via bottom 16 and from the overhang 14 at the via entrance. If the metal being etched is a barrier layer, the decrease in the thickness at the via bottom 16 reduces the overall contact resistance of the via and improves device performance.

The deposition and etch cycles are described with reference to the iPVD apparatus 20, illustrated in FIG. 3. For ionized PVD, a wafer 21 is held in place on top of a temperature-controlled electrostatic chuck 22. Sputtering gas is supplied from a source 23 into a vacuum processing chamber 30, the pressure of which is maintained at a vacuum by pump 29 and adjusted to a proper ionized deposition range for iPVD. DC power is supplied from a power source 24 to target 25, and RF power is supplied to an antenna 26 from an RF generator 27. These electrical power sources 24 and 27 are turned on to power levels appropriate for the deposition by iPVD. Wafer RF bias is supplied to the chuck 22 by RF bias generator 28, which can also be turned on to a level appropriate during deposition to provide a net negative bias on the wafer 21 to improve and affect the process. The antenna 26 is positioned outside of the chamber 30 behind a dielectric window 31 in the chamber wall 32. A louvered deposition baffle 33, preferably formed of a slotted metallic material, is located inside of the chamber 30 closely spaced from the window 31 to shield the window 31 from deposition. A permanent magnet pack 34 is located behind the target 25 to produce a magnetic tunnel over the target 25 for magnetron sputtering.

The temperature of the wafer 21 is controlled to obtain the best via metallization. The wafer table 22 is equipped with a Z-motion drive 35 to adjust the substrate-to-source distance to provide the best deposition uniformity, and the best coverage and symmetry of the sidewall 16 and bottom 15 of the via 11. Some typical ionized PVD deposition parameters are given in Table I.

TABLE I

Typical Ionized PVD Deposition Parameters

| Material | DC Power (kW) | ICP Power (kW) | RF Wafer Bias Power (W) | Pressure (mT) | $N_2$ Flow (% of Total Flow) | Wafer Table Temp (° C.) |
|---|---|---|---|---|---|---|
| Ta | 8–19 | 1–7 | 0–200 | 50–120 | — | 25–100 |
| $TaN_x$ | 8–19 | 1–7 | 0–200 | 50–120 | 3–50 | 25–100 |
| Cu | 8–19 | 1–7 | 0–100 | 50–100 | — | –50–0 |

For the processes represented by Table I, the substrate-to-source distance can typically be 150 to 275 mm. Argon gas is the typical sputtering gas. To deposit a barrier layer of a metal nitride such as $TaN_x$, nitrogen gas, in addition to Argon gas, is used during sputter deposition.

After a certain desired amount of deposition, the DC power 24 to the target 25 is reduced or turned off to substantially reduce or stop the deposition process. Those skilled in this art will realize that the deposition process can be substantially reduced and/or stopped by reducing the DC power level 24 to a very low level without completely turning it off. The RF excitation to the ICP antenna is kept on to continue to generate an Argon plasma. At this point, chamber Ar pressure, ICP power, RF substrate bias power and substrate-to-source distance is adjusted to provide optimum etch conditions. If the previous deposition step was for a metal nitride, nitrogen flow to the chamber may be turned off or reduced. The temperature of the wafer table 22 can also be modified for the etch step, but this is usually not necessary. Typical etch conditions are given in Table II.

TABLE II

Typical Etch Process Parameters for Metals and Metal Nitrides

| ICP Power (W) | RF Wafer Bias Power (W) | Pressure (mT) |
|---|---|---|
| 50–3000 | 100–1000 | 0.1–2 mT |

In processes of the prior art, agglomeration of a seed metal layer is common, which results in voids occurring in an electroplated fill that is deposited over the seed layer, which leads to unacceptable product with reliability problems.

In accordance with the present invention, wafer temperature is controlled during both the sequential deposition and etch steps. These processes may be achieved in the apparatus described in U.S. Pat. No. 6,287,435 by providing the electrostatic chuck 22 with cooling fluid passages and the appropriate temperature controls. Good thermal contact between the chuck 22 and the wafer 21 can be achieved by providing backside gas conduction between the wafer 21 and the chuck 22. Backside gas pressure can be controlled during both deposition and etch steps to insure that thin metal deposition, especially at the sidewalls of the via structures, are not agglomerated.

During the etch step, especially for copper deposition-etching process, the copper film must be kept cold and not allowed to heat up during the etching step where energetic ions bombard the substrate under the influence of relatively high substrate bias. The purpose of the etch step is to reduce the amount of overhang which is detrimental to a successful via or trench fill and to reduce the thickness of the bottom coverage. It is also the objective of the etch step to redeposit more material to the sidewalls of the vias and trenches to make the film there more continuous. If the temperature of the substrate 21 is not controlled and is allowed to increase during the etch step, the mobility of the copper atoms increases and they diffuse on the surface of the substrate 21 and result in agglomeration of large copper nodules at the sidewalls 16 of the vias and trenches 11 instead of forming a continuous copper film. Therefore, the substrate temperature is controlled and kept cold during the etch step.

For example, during etch, the power to the substrate table 22 from the bias power generator 28 is maintained at about 500 watts, which results in about –300 volts bias on the wafer table 22. Heat generated at the substrate 21 during such etch step is extracted efficiently by the wafer chuck 22 to keep the temperature of the wafer 21 at substantially below room temperature, preferably below 0°, preferably to about −30° Celsius.

After the etching step, another deposition step may be administered. The cycle of deposition followed by etching may be repeated once or as many times as required. In another embodiment, at least one etch step may be employed during the entire process. Such etching process can, for example, occur between two deposition steps. In one embodiment of the process of the invention, a typical barrier process may include a tantalum nitride deposition followed by an etch step followed further by a tantalum metal deposition followed by another etch step. Thickness of material deposited during the deposition step is larger as compared to the thickness removed during etching, resulting in net deposition.

Figure 4:
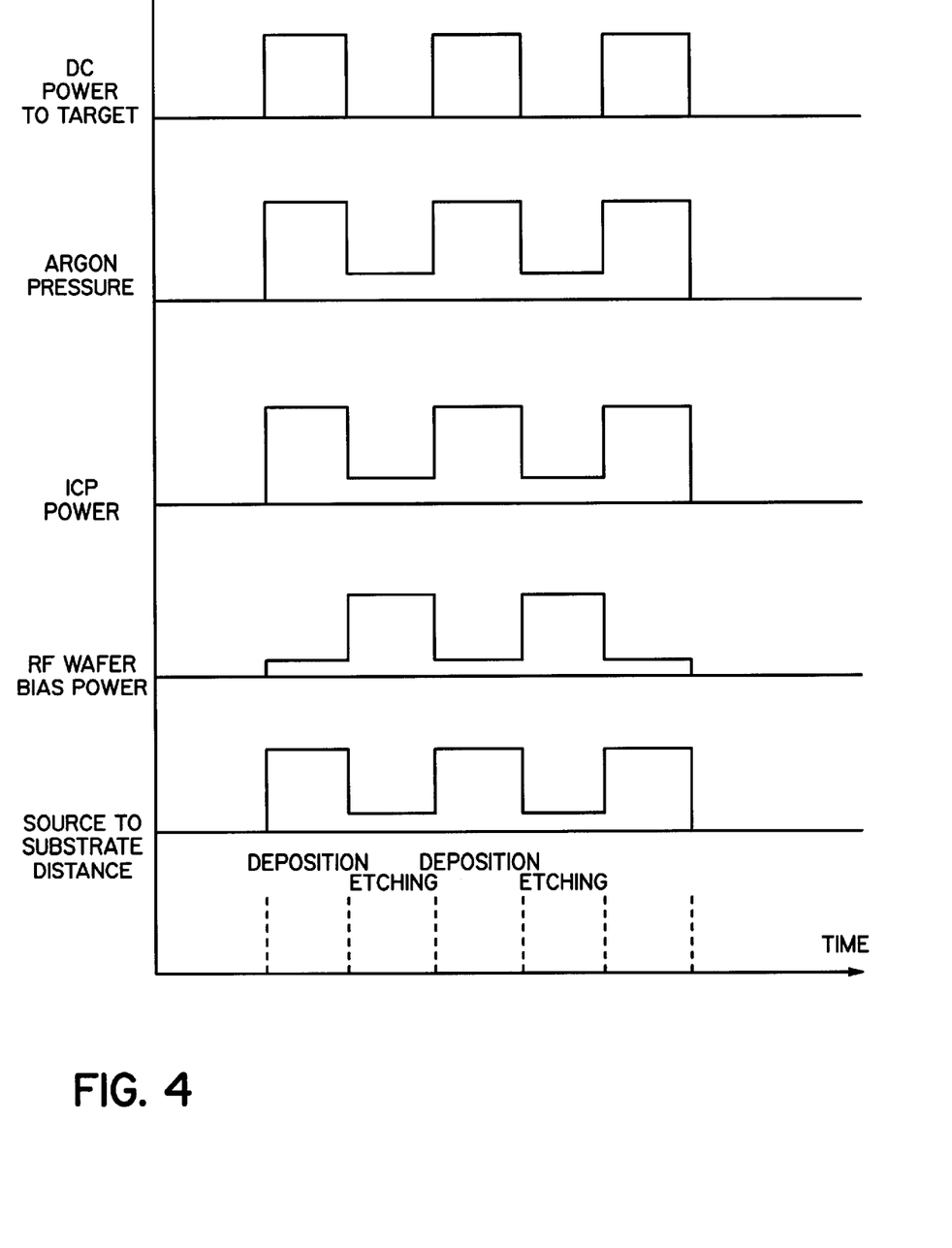
FIG. 4 is a graph illustrating the switching of parameters during a sequential deposition and etching process according to an embodiment of the present invention.

In one sequence of operation, each cycle may have fixed deposition and fixed etch parameters, such as fixed time, pressure, DC and RF power levels and source-to-substrate distances for each of the deposition and etch modes. An example of this sequence of operation is depicted in FIG. 4, where DC power from the power source 24 to the target 25 is switched on for deposition and off for etching. Argon gas vacuum pressure is switched between a higher pressure for deposition and a lower pressure for etching by control of the pump 29 and gas flow in 23. ICP power from the RF generator 27 to the antenna 26 is switched between a higher power level for deposition and a lower power level for etching. RF bias power from the generator 28 to the table 22 is switched from a lower bias for deposition and a higher bias for etching. The Z-drive 35 moves the table 22 to bring the wafer closer to the source (which includes the target 25 and the antenna 26) for etching than for deposition.

Figure 5:
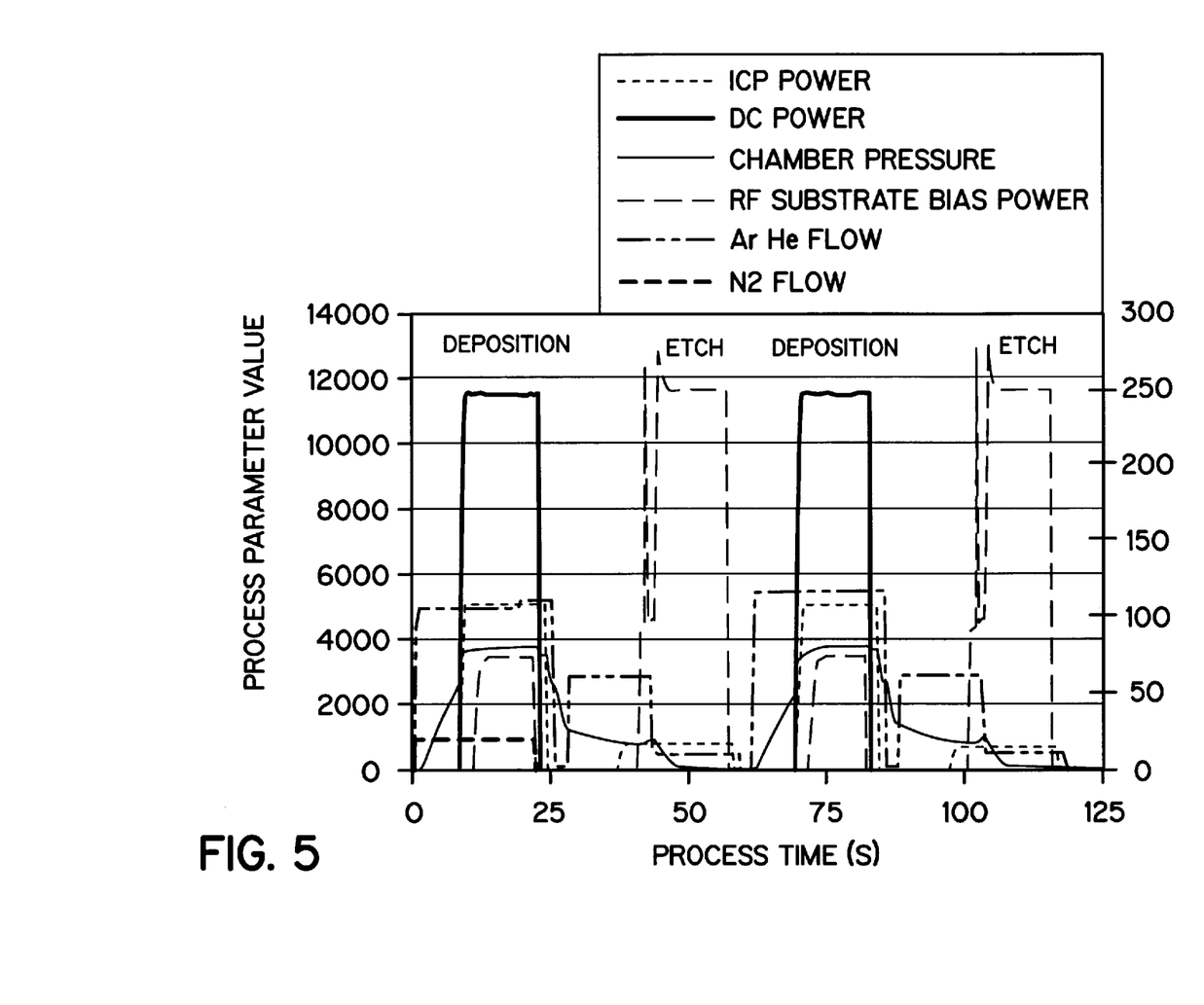
FIG. 5 is a graph illustrating the variation of parameters during a sequential deposition and etching process according to another embodiment of the present invention.

In another sequence of operation of the system performing a process of the invention, relative portions of deposition and etch modes, and their respective process parameters, may be varied during the cycle of from cycle to cycle to affect the best overall final result. An example of this sequence is represented by FIG. 5, on which various curves are superimposed to better show their time relationships. The advantage of the system performing this embodiment of the process is that it allows fast change from deposition mode to etching mode. The ability of the apparatus to provide both a uniform deposition at high pressures, which has its own advantages, and a uniform etch at low pressure facilitates the achieving of the required results with high throughput. The iPVD source of the apparatus set forth in U.S. Pat. No. 6,287,435 and PCT application PCT/US00/31756 exhibits uniform or highly directional metal flux to the wafer. Such a source includes a frusto-conical target or annular ring-shaped target with an RF coil behind a dielectric window at the center of the target. With such a source, under certain circumstances, the flux of positive argon ions onto the wafer may be non-uniform, and rather centrally peaked, exhibiting a broad angular distribution around lines normal to the substrate. This may be suitable for higher pressure deposition. But re-sputtering during an etch portion of a cycle of material deposited during the deposition portion of the cycle would be more pronounced at the center than at the edge of the wafer, which may be undesirable for the etching that is to be carried out. Lowering the pressure during the sputter etch step causes the flux of positive argon ions onto the wafer to become more uniform and with the help of wafer bias, more directional and perpendicular to the substrate. The Z-distance adjustment to control the plasma source-to-wafer spacing can be made to provide the best etch and deposition uniformity.

Lowering the pressure during the etch step achieves another benefit. At higher pressures, such as are typically used during the deposition portions of the cycle with the iPVD source discussed above, material ejected into the plasma from the wafer undergoes multiple collisions and may be reflected back onto the wafer being ionized. This flux of thermalized material can increase the overhang. This overhang is reduced by the deposition-etch iPVD process, because at the lower pressures, the mean free path of material sputtered from the wafer is longer, and it is much less likely to be reflected back onto the wafer before it is either ionized or impacts walls 31 of the chamber 30. Ideally, the deposition-etch cycle should be rapid, so as to allow large numbers of cycles in a typical process time of 60 sec. A pulsed DC power supply with variable duty cycle would be ideally suited for this purpose. Substrate-to-source spacing is similar to that in FIG. 4.

Figure 5A:
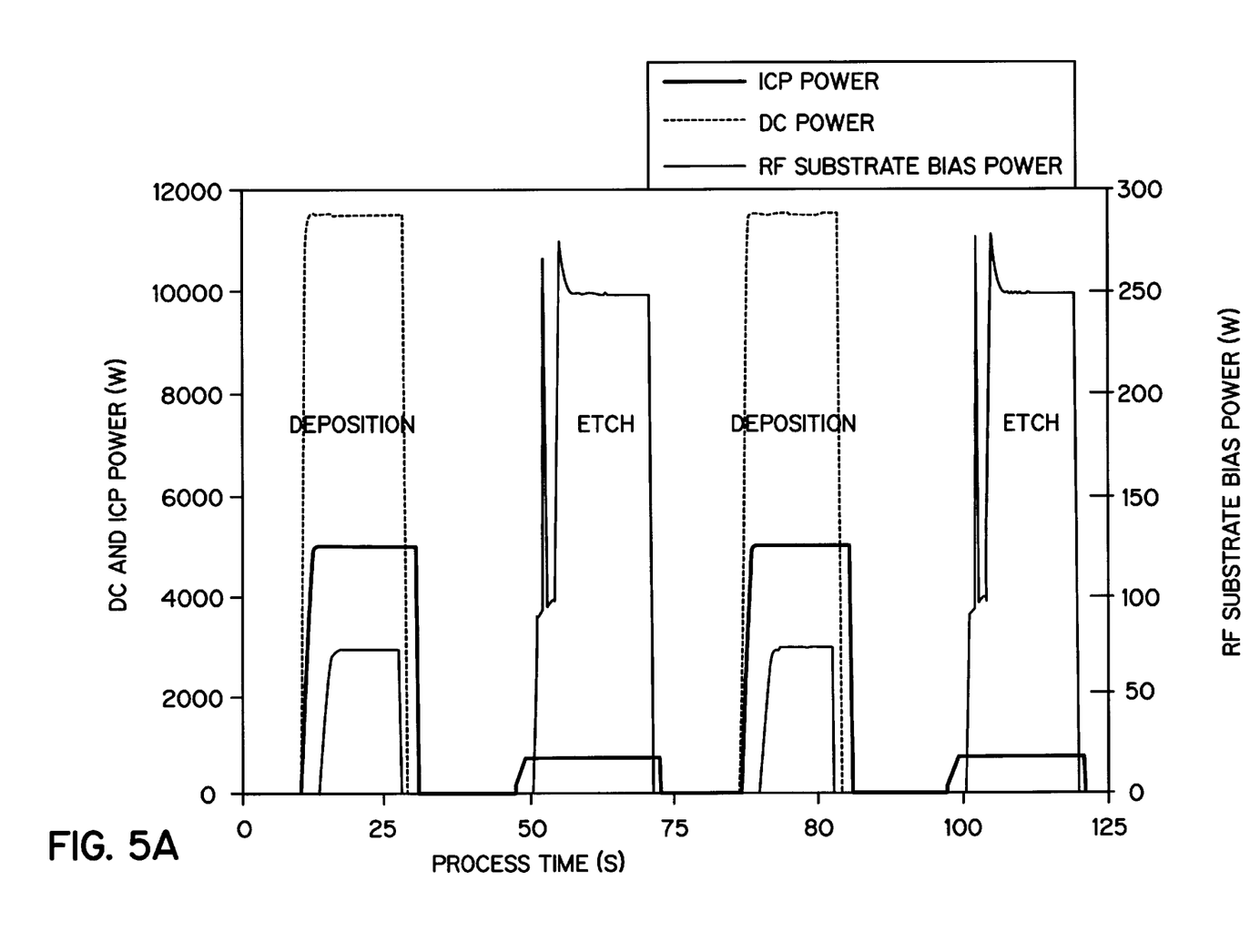
FIGS. 5A and 5B are graphs illustrating selected portions of the graph of FIG. 5 in more detail.
Figure 5B:
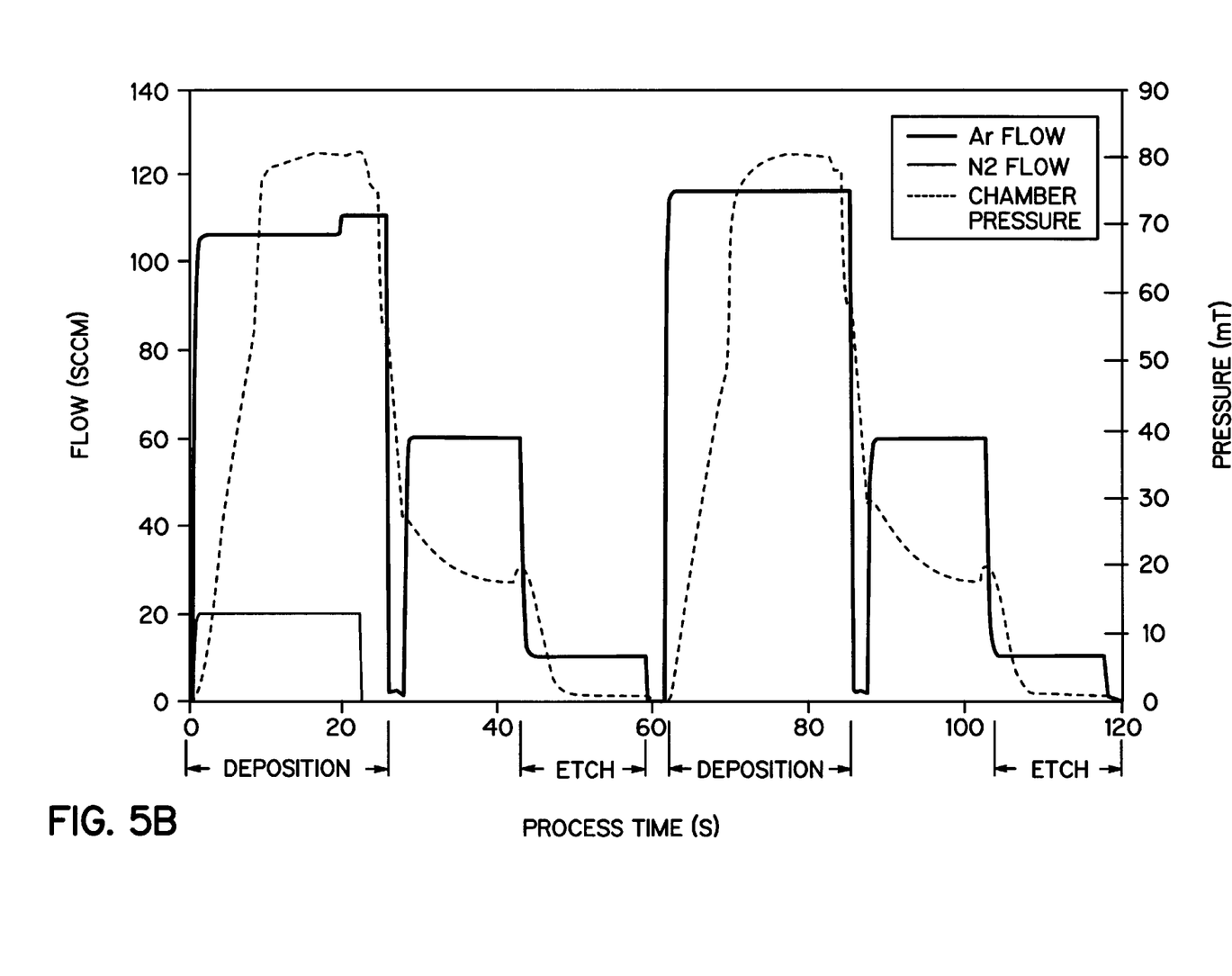

In FIG. 5, "ICP Power" refers to the RF inductively coupled power from generator 27 for forming the dense plasma, while "RF Substrate Bias Power" refers to the RF power applied to the table 22 from the generator 28 to create a negative bias on the substrate 21. "DC Power" refers to DC power applied from the power supply or source 24 to the target 25 material to cause material to sputter. The parameters may be controlled so that the plasma, ignited during the higher pressure deposition step, is sustained continuously throughout the etch step. FIG. 5 illustrates actual data of the operation of a system in which this is not the case, and in which argon flow is increased prior to the etch step to reignite the plasma. The re-ignition of the plasma is responsible for the apparent spike in the RF substrate bias power in FIG. 5. FIGS. 5A and 5B are provided to separate the parameter plots of FIG. 5 for clarity.

Figure 6:
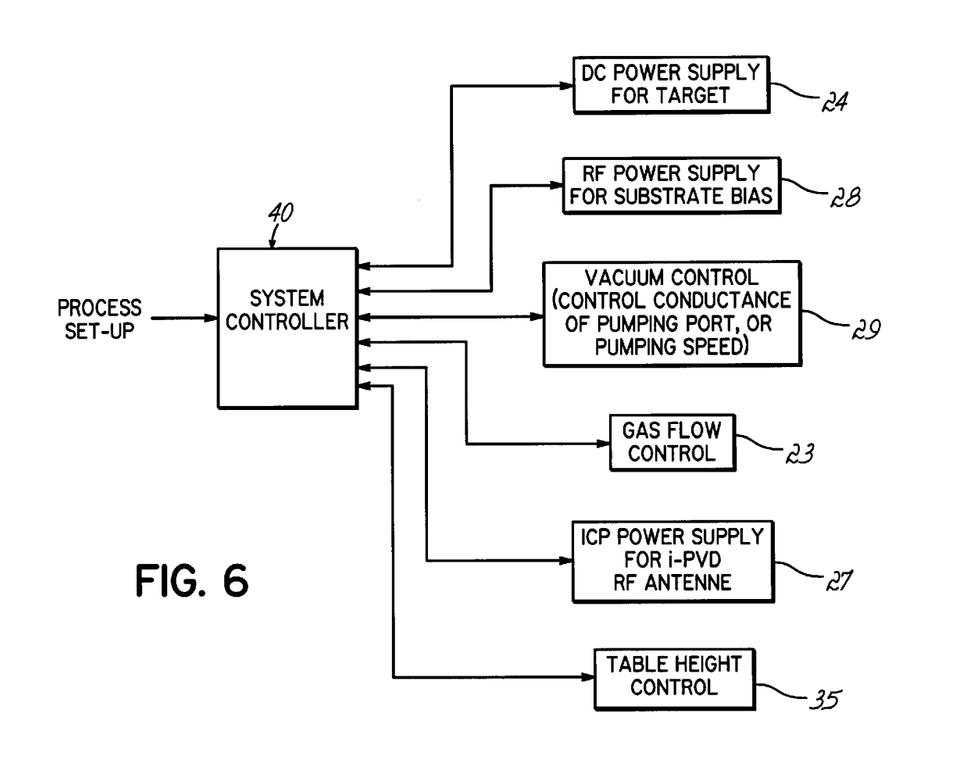
FIG. 6 is a diagram illustrating a portion of a control system for the apparatus of FIG. 3, 3A or 3B.

A system controller 40 is programmed to achieve the parameter control depicted in FIGS. 4 and 5, and is set forth in the diagram of FIG. 6.

The process of the invention is particularly advantageous when used with apparatus 20 referred to above, which deposits materials, particularly metal, over a wide pressure range, which includes deposition pressures in the range of 1–150 mTorr or higher, and is particularly useful where pressures are in the range of from 50–150 mTorr, or at such other pressures at which sputtered material undergoes a large number of collisions, or is "thermalized", between the target and the substrate.

The apparatus 20 also has the advantage of being able to deposit over a wide RF table power range, allowing deposition at very high table powers. Low table power processing combined with an etch can only remove part of the overhang before all the sidewall and bottom material (at least for the barrier layer) is removed as well. A high table power deposition process results in high bottom coverage and thick deposition on the bottom sidewall as well as better sidewall coverage on the rest of the via, thereby allowing the etch step to run until the overhang is more completely removed. These benefits occur as a result of developing a sufficiently high DC bias on the wafer 21 that simultaneously re-sputters while depositing as well as affecting the trajectories of the ions in a direction more perpendicular to the wafer 21. This enhances coverage at the feature bottom 15 and allows for more etching of the overhang before the material at the feature bottom is removed. With the ability to optimize table power and deposition pressure, the increase of the overhang during the high table power deposition from redeposition of resputtered material can be minimized, allowing for an overall reduction of the overhang by the etch processes.

The deposition/etch cycles are preferably carried out by rapid and repeated switching between high deposition pressures and lower etch pressures of less than 10 mTorr, particularly of from a few mTorr down to 0.1 mTorr or lower. The pressure switching is carried out while switching sputtering power on the target and switching of bias power on the substrate between levels. The substrate bias can be shifted or switched by the pulsing of RF power on the substrate. Optionally, the substrate bias can be switched between two levels of RF power. The substrate bias switching produces a negative potential on the substrate relative to the plasma of tens of volts during deposition and of hundreds of volts during etching, while the target DC bias switches between a negative target sputtering voltage during deposition and zero or near zero volts during etching. Bias power during etching is preferably an order of magnitude or more than during deposition.

The switching is preferably in cycles of about one second per cycle, or in the range of 0.1 to 20 seconds per cycle, with the total processing time per wafer being preferably in the range of one minute or less, although with some processes longer processing times may occur.

According to other embodiments of the invention, the flux of positive argon ions onto the wafer during the etch portion of the cycle is made uniform or directional like the metal flux from the iPVD source during the deposition portion of the cycle. This is achieved by surrounding the chamber described above with another solenoidal coil 41, which can be located either internal to the chamber 30, as illustrated in FIG. 3A, or external to the plasma. With such a coil 41, the positive argon ion flux can be made more uniformly perpendicular to the substrate 21. This dual coil system that includes coil 41 and the antenna 26 can be pulsed in such a way as to deposit as little as several mono-layers onto the surface of the substrate during deposition, and then interrupt deposition so as to have the effect of sputtering material from the top corners 14 of the feature 11 and the bottom 15 of the feature 11 where relatively large amounts of material are deposited, onto the sidewalls 16 where little material is deposited but where coverage is most critical (see FIG. 1).

Figure 3:
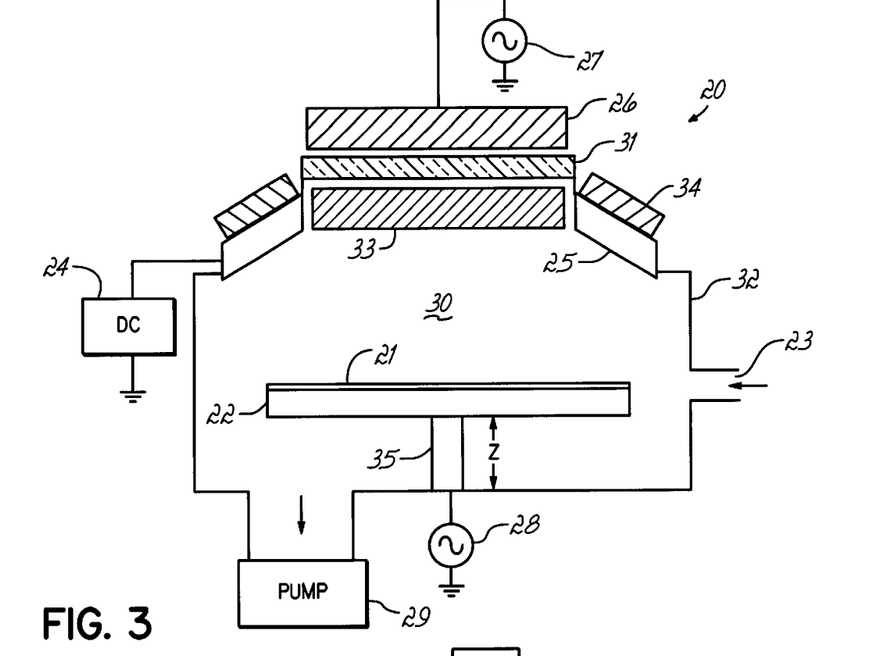
FIG. 3 is a diagram of the cross-section of one embodiment of an iPVD apparatus for use with the present invention.
Figure 3A:
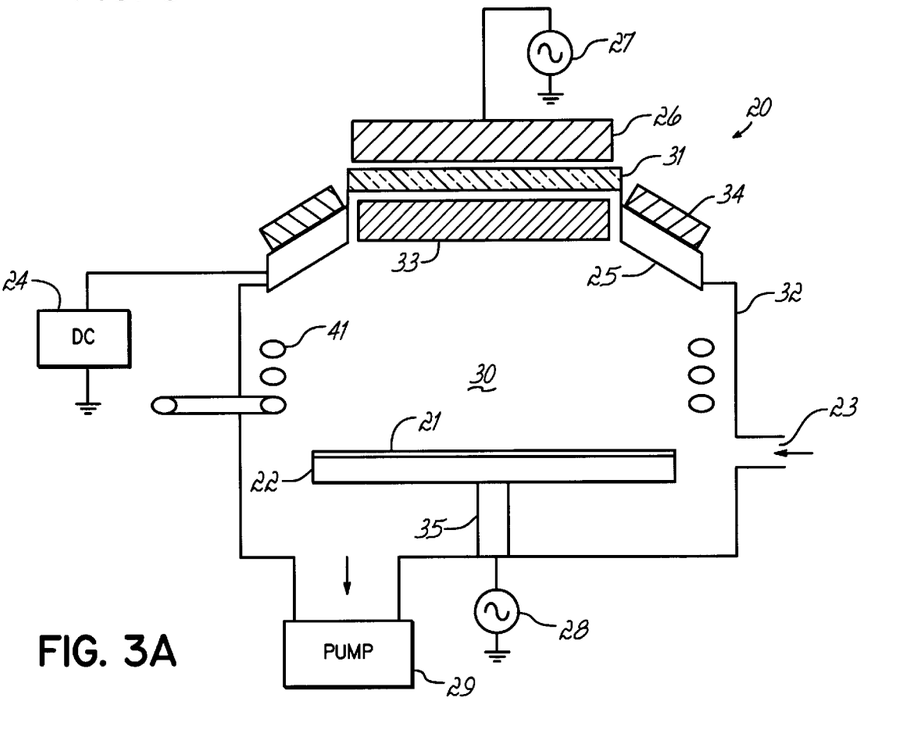
FIG. 3A is a diagram similar to FIG. 3 of the cross-section of another embodiment of an iPVD apparatus for use with the present invention.
Figure 3B:
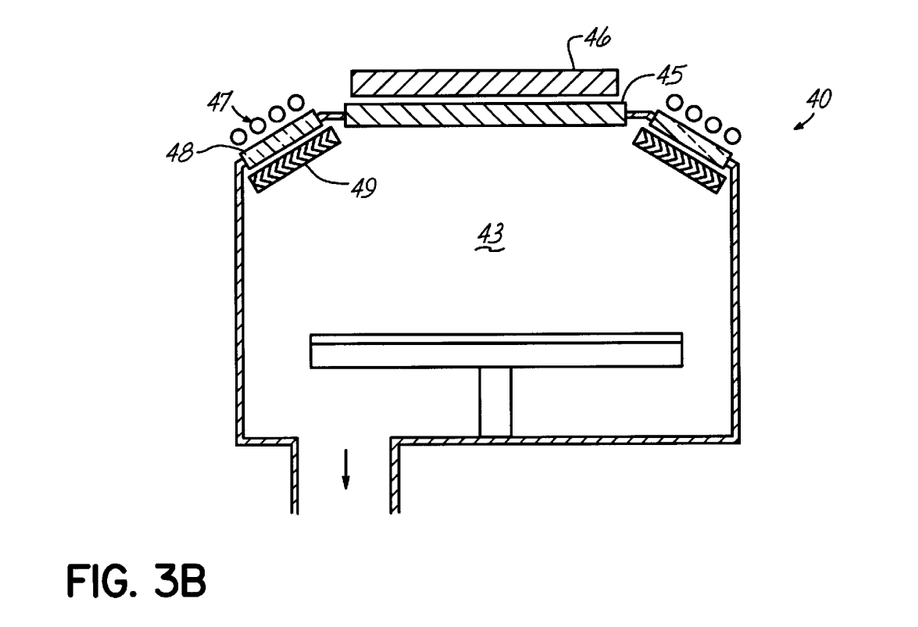
FIG. 3B is a diagram similar to FIGS. 3 and 3A of the cross-section of still another embodiment of an iPVD apparatus for use with the present invention.

Another alternative configuration 40 includes a conical ICP source 44 with a traditional planar magnetron at the center thereof that includes a target 45 behind which is a magnet assembly 46, as depicted in FIG. 3B. The source 44 includes a conical coil 47 outside of a chamber 43 behind a dielectric window 48 in the chamber wall 42, with a conical deposition baffle 49 protecting the window 48 from deposition.

The configurations described above may be run at higher pressure when depositing metal than when etching. For this eventuality, a rapid wave of pumping out the chamber may be provided. This may utilize the pumping scheme shown in FIG. 7.

Figure 7:
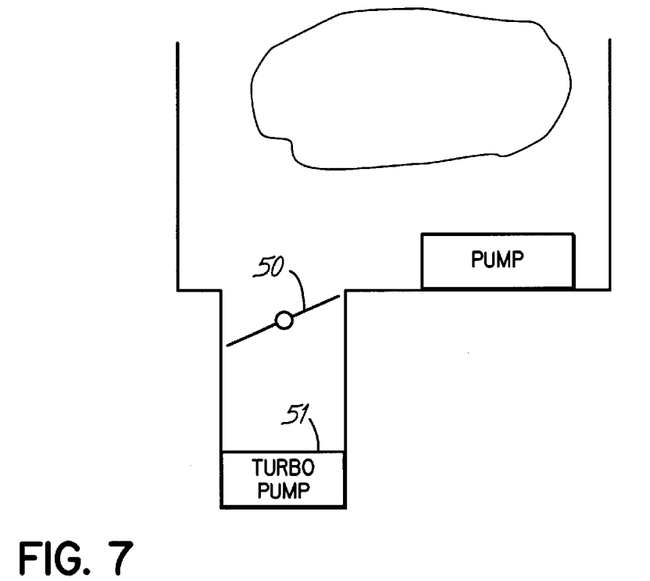
FIGS. 7 and 7A are diagrams illustrating portions of alternative gas flow control systems for the apparatus of FIG. 3, 3A or 3B.
Figure 7A:
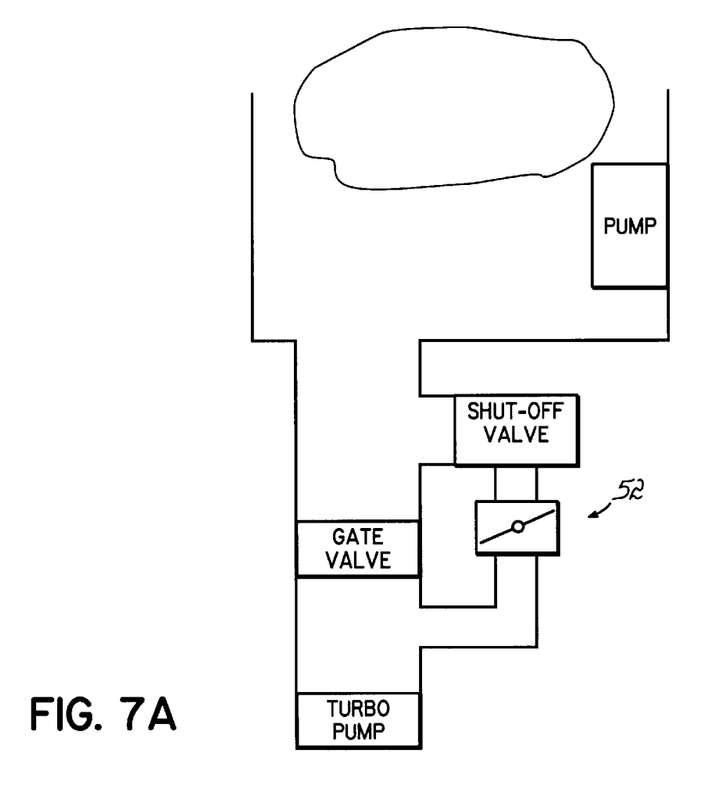

Chambers such as illustrated in FIGS. 3, 3A and 3B may be equipped with a throttling gate valve 50 and turbo pump, as illustrating in FIG. 7. For cases where such a throttling gate valve 50 does not have the ability to control the range of conductances desired, the pumping configuration of FIG. 7A may be used with a parallel branch 52 employed to increase the range of conductance.

The pressure difference between sputter deposition and etching can also be achieved by varying the gas flow rate into the sputtering chamber. A combination of gas flow change and pumping speed change may also be utilized.

The gas may be argon, which is often preferred, but may also be any other inert gas or may be a non-inert gas that is compatible with the process.

Sputtered material can be Copper, Ta, or any other metal, a dielectric material, which will need further RF power supply for the electrically non-conductive target, or a semiconductor material.

Resputtering of thick deposits of barrier layer materials such as tantalum, TaN, TiN and titanium from the bottoms of features is useful in avoiding high contact resistances, which such thick deposits of such materials at the bottoms of the features causes.

With conductor materials such as copper that are deposited over the barrier layer materials, resputtering of the material from the edges avoids the shading of the insides of the features, which such overhanging material causes, which inhibits effective bottom-up filling of the feature in a subsequent plating process.

The directionality of the argon ions during the etching can be controlled so as to facilitate resputtering from the edges of the features onto the sidewalls at the upper half or portion of the feature and resputtering from the bottom of the feature onto the sidewalls at the lower half or portion of the feature.

The invention may also be used where the deposition process is a reactive process, for example, a process used to deposit compound films such as TiN, TaN, SiN, etc. In such cases, during deposition, $N_2$ or some other reactive gas is introduced into the chamber in addition to Ar gas.

RF power supply frequencies can be chosen for best system and process results. Typical frequencies might be 13.56 MHz or 2 MHz but are not limited to these frequencies.

Those skilled in the art will appreciate that deletions, additions and modifications can be made to the above described embodiments without departing from the principles of the invention.

Therefore, the following is claimed:

1. An iPVD process comprising:
    sealing a substrate within a chamber of an IPVD apparatus and, without opening the chamber:
        inductively coupling a high density plasma into a space within the chamber to produce ions of coating material for deposit onto the substrate during deposition modes and to produce ions for etching the substrate during etch modes, and
        performing an iPVD process to deposit a conductive layer on surfaces of high aspect ratio submicron features on the substrate by operating the apparatus in a deposition mode, followed by an etch mode, followed by another deposition mode; and
    the modes being affected by controlling the apparatus to operate at power and pressure parameters that are different during the deposition modes than during the etch mode, including operating the apparatus at a first processing pressure in a deposition mode, then lowering the pressure to operate the apparatus at a second processing pressure in an etch mode, then raising the pressure to operate again at the first processing pressure in a subsequent deposition mode.

2. The method of claim 1 for depositing coatings on semiconductor features having diameters of 0.15 microns or less and aspect ratios of three or more, wherein the performing of the iPVD process comprises:
    operating the apparatus in the deposition mode at a pressure of at least approximately 50 mTorr while sputtering material from a target into the high density plasma to ionize the material, and depositing the ionized material with a high degree of directionality normal to and onto the substrate; and
    operating the apparatus in the etch mode at a pressure of less than approximately 10 mTorr and with a bias on the substrate having a magnitude of substantially more than 100 volts without sputtering substantial material from the target.

3. The method of claim 2 further comprising:

operating of the apparatus in the deposition mode with a bias on the substrate and wherein said bias has a magnitude of substantially less than the bias on the substrate during the etch mode.

4. An iPVD processing apparatus having a controller programmed to operate the apparatus according to the method of claim 2.

5. The method of claim 1 further comprising:

when changing from a deposition mode to an etch mode, increasing bias power on the substrate to cause a net etching during the etch mode of deposited material from the substrate by ions of gas from the plasma; and when changing from an etch mode to a deposition mode, reducing the bias power on the substrate to attract ionized material from the plasma to cause a net coating of material onto the substrate.

6. The method of claim 5 wherein:

the bias power on the substrate during the etch mode is higher than the bias power on the substrate during the deposition mode by at least approximately one order of magnitude.

7. The method of claim 1 wherein:

the etch mode is carried out by sputtering with ions from the plasma under parameters that cause at least one of the effects selected from the group consisting essentially of:
   at least partially removing deposited material that overhangs edges of the features on the substrate,
   at least partially removing deposited material from the bottoms of the features, and
   resputtering deposited material from the substrate onto sidewalls of the features.

8. The method of claim 7 wherein:

the etch mode is carried out by sputtering with ions from the plasma under parameters that cause at least two of said effects.

9. The method of claim 7 wherein:

the etch mode is carried out by sputtering with ions from the plasma under parameters that cause all three of said effects.

10. The method of claim 1 further comprising:

cooling the substrate during deposition and etching.

11. The method of claim 1 further comprising:

cooling the substrate to substantially below 0° C. during etching.

12. The method of claim 1 further comprising:

switching DC power to a sputtering target on during deposition and substantially off during etching.

13. The method of claim 1 further comprising:

forming a high density plasma in the chamber by RF energy from an RF source outside of the chamber.

14. The iPVD processing apparatus having a controller programmed to operate the apparatus according to the method of claim 1.

15. An iPVD processing apparatus having a controller programmed to operate the apparatus according to the method of claim 1 and further:

when changing from deposition mode to etch mode, to increase bias power on the substrate to cause a nit etching during the etch mode of deposited material from the substrate by ions of gas from the plasma, and, when changing from an etch mode to a deposition mode, reducing the bias power on the substrate to attract ionized material from the plasma to cause a net coating of material onto the substrate.

16. The method of claim 1 wherein:

the process includes at least three successive cycles, each including a deposition mode followed by an etch mode; and each cycle is between approximately 0.1 and 20 seconds in duration.

17. The method of claim 1 wherein:

the process includes at least three successive cycles, each including a deposition mode followed by an etch mode; and the process is approximately one minute in length and the deposition/etch cycles are approximately one second in length.

18. The method of claim 1 wherein:

the modes are affected by controlling the apparatus to position the substrate at one distance relative to the source during deposition modes, to reposition the substrate at another and different distance relative to the source during etch modes.

19. The method of claim 1 wherein:

the controlling of the apparatus includes, subsequent to the subsequent deposition mode, again lowering the pressure to operate the apparatus at the second processing pressure in a further etch mode.

20. An iPVD process comprising:

sealing a substrate within a chamber of an iPVD apparatus, and, without opening the chamber, forming a high density plasma in a space within the chamber to produce ions of coating material for deposit onto the substrate during deposition modes and to produce ions for etching the substrate during etch modes, performing an iPVD process to deposit a layer of material from a material source onto surfaces of the substrate;

the performing of the iPVD process including operating the apparatus alternatively in deposition modes and etch modes, the modes including at least a first deposition mode, then an etch mode, then a second deposition mode; and controlling the apparatus to change the relative distance of the substrate from the space to locate the substrate at one position relative to the space during the first deposition mode, and then repositioning the substrate at another position relative to the space during the etch mode, and then again repositioning the substrate at said one position relative to the source during said second deposition mode.

21. The method of claim 20 further comprising:

positioning the substrate at said one position relative to the space during deposition modes and repositioning the substrate at said another position closer to the space during etch modes.

22. The method of claim 20 wherein:

the forming of a high density plasma in a space within the chamber includes coupling RF energy into the space to produce ions of coating material for deposit onto the substrate during deposition modes and to produce ions for etching the substrate during etch modes; and RF energy is coupled into the space at one power level during deposition modes and at a different power level during etch modes.

23. The method of claim 20 wherein:

the forming of a high density plasma in a space within the chamber includes coupling RF energy into the space to produce ions of coating material for deposit onto the substrate during deposition modes and to produce ions for etching the substrate during etch modes; and RF energy is coupled into the space at one power level during deposition modes and at a lower power level during etch modes.

24. The method of claim 20 wherein:

the controlling of the apparatus to operate at parameters that are different during the deposition modes than during the etch mode includes controlling the apparatus to operate at power and pressure parameters that are different during the deposition modes than during the etch mode.

25. The method of claim 20 wherein:

the controlling of the apparatus to operate at parameters that are different during the deposition modes than during the etch mode includes controlling the apparatus to operate at power and pressure parameters that are different during the deposition modes than during the etch mode and positioning the substrate at one distance relative to the source during deposition modes and repositioning the substrate at a relative distance closer to the source during etch modes.

26. The method of claim 20 wherein:

operating the apparatus in the deposition modes at a pressure in the chamber of at least approximately 50 mTorr; and operating the apparatus in the etch mode at a pressure of less than approximately 10mTorr.

27. The method in claim 20 wherein:

operating of the apparatus in the deposition mode with a bias on the substrate and wherein said bias has a magnitude of substantially less than the bias on the substrate during the etch mode.

28. The method of claim 20 wherein:

the process includes at least three successive cycles, each including a deposition mode followed by an etch mode; and each cycle is between approximately 0.1 and 20 seconds in duration.

29. The method of claim 20 wherein:

the process includes at least three successive cycles, each including a deposition mode followed by an etch mode; and the process is approximately one minute in length and the deposition/etch cycles are approximately one second in length.

30. The method of claim 20 wherein:

the process includes at least three successive cycles, each including a deposition mode followed by an etch mode;

each cycle is between approximately 0.1 and 20 seconds in duration; and the controlling of the apparatus to operate at parameters that are different during the deposition modes than during the etch mode includes controlling the apparatus to operate at power and pressure parameters that are different during the deposition modes than during the etch mode and positioning the substrate at one distance relative to the source during deposition modes and repositioning the substrate at a relative distance closer to the source during etch modes.

31. The method of claim 20 wherein:

the performing of the iPVD process includes operating the apparatus alternatively in deposition modes and etch modes that further include a second etch mode following the second deposition mode; and the controlling of the apparatus includes repositioning the substrate at said another position relative to the source during a second etch mode.

32. An iPVD apparatus comprising:

a vacuum chamber therein and being operable to perform ionized physical vapor deposition on a substrate therein over a pressure range of from approximately 0.1 to over 100 mTorr;

a target at one end of the chamber and a substrate support at the other end of the chamber;

an RF energy source;

an antenna coupled to the RF energy source and effective to inductively couple RF energy to form a high density inductively coupled plasma in the chamber; and a controller programmed to operate the apparatus to perform a coating process on a substrate while that substrate is sealed in the vacuum chamber, the process including a plurality of successive deposition/etch cycles, each cycle including a deposition step followed by an etch step, the controller being operable to switch a plurality of times back and forth between deposition and etch steps, where the deposition steps include:

operating the apparatus at a pressure sufficiently high to thermalize material sputtered from the target into the plasma and sputtering material from a sputtering target into the plasma to ionize the material and depositing the material with a high degree of directional uniformity normal to and onto a wafer, and the etch steps include:

operating the apparatus at a pressure lower than that which will thermalize particles in the plasma and, without sputtering material from the target, accelerating ions of gas from the plasma onto the substrate to etch deposited material from substrate and cause removal of deposited material that overhangs edges of the features on the substrate and to resputter material from the bottoms of the features onto sidewalls of the features, the controller being further programmed to operate the apparatus to change the relative distance of the substrate from the space to locate the substrate at one position relative to the space during deposition modes, and to reposition the substrate at another and different position relative to the space during etch modes.

33. The iPVD processing apparatus of claim 32 wherein:

the process includes at least three deposition/etch cycles; and each deposition/etch cycle is between approximately 0.1 and 20 seconds in duration 34. The iPVD processing apparatus of claim 33 wherein:

the process is approximately one minute in length and the deposition/etch cycles are approximately one second in length.

35. An iPVD process comprising:

sealing a substrate within a chamber of an iPVD apparatus that has a coating material source in communication with a space within the chamber, an RF energy source inductively coupled to the space and a processing gas communicated into the space;

without opening the chamber;

coating a substrate sealed in the vacuum chamber by performing a plurality of successive cycles that each include a deposition step followed by an etch step by switching a plurality of times back and forth between deposition and etch steps, where the deposition steps include:

ionizing in the space, with a thermalized plasma, by RF energy coupled from the RF energy source, material from the coating material source, while controlling parameters of the apparatus to deposit the material with a high degree of directional uniformity normal to and onto the substrate, and the etch steps include:

ionizing in the space, with the plasma energized by RF energy coupled from the RF energy source, gas communicated therein, while controlling parameters of the apparatus to etch material deposited on the substrate during deposition steps.

36. The method of claim 35 wherein the controlling of the parameters includes:

operating the apparatus during deposition steps at a pressure in the chamber of at least approximately 50 mTorr; and operating the apparatus during etch steps at a pressure of less than approximately 10mTorr.

37. The method of claim 35 wherein the controlling of the parameters includes:

changing the relative distance between the substrate and the RF energy space when switching between deposition and etch steps.

38. The method of claim 35 wherein the controlling of the parameters includes:

changing the relative distance between the substrate and the RF energy space when switching between deposition and etch steps such that the substrate is closer to the space containing the plasma during etch steps than during deposition steps.

39. The method of claim 35 wherein the controlling of the parameters includes:

operating of the apparatus with a bias on the substrate having a magnitude of substantially more during the etch steps than during deposition steps.

40. The method of claim 35 wherein:

the successive cycles of the plurality are between approximately 0.1 and 20 seconds in duration.

41. The method of claim 35 wherein the coating material source includes a sputtering target, and the controlling of the parameters includes:

switching DC power to the sputtering target on during deposition steps and substantially off during etch steps.

42. The method of claim 35 wherein the controlling of the parameters includes:

coupling RF energy into the space at one power level during deposition steps and at a different power level during etch steps.

43. The method of claim 35 wherein the successive cycles of the plurality are between approximately 0.1 and 20 seconds in duration and the controlling of the parameters includes:

operating the apparatus during deposition steps at a pressure in the chamber of at least approximately 50 mTorr and operating the apparatus during etch steps at a pressure of less than approximately 10mTorr;

changing the relative distance between the substrate and the RF energy space when switching between deposition and etch steps such that the substrate is closer to the space containing the plasma during etch steps than during deposition steps;

operating of the apparatus with a bias on the substrate having a magnitude of substantially more during the etch steps than during deposition steps;

switching DC power to the coating material source on during deposition steps and substantially off during etch steps; and coupling RF energy into the space at one power level during deposition steps and at a different power level during etch steps.

* * * * *

UNITED STATES PATENT AND TRADEMARK OFFICE
CERTIFICATE OF CORRECTION

PATENT NO.    : 6,755,945 B2
DATED         : June 29, 2004
INVENTOR(S)   : Yasar et al.

It is certified that error appears in the above-identified patent and that said Letters Patent is hereby corrected as shown below:

Column 1,
Line 50, reads "… dimensions go down below 0.15 micrometers, ionized …" and should read -- "… dimensions go down below 0.15 micrometer, ionized… --.

Column 2,
Line 23, reads "Another suggestion of Van Buskirk, et al., is to…" and should read -- Another suggestion of Van Buskirk, et al., to… --.

Column 3,
Line 20, reads "…diameters of 0.15 micrometers or less with aspect ratios of…" and should read -- …diameters of 0.15 micrometer or less with aspect ratios of… --.

Column 4,
Line 53, reads "…via dimensions decrease to below 0.15 micrometers with no…" and should read -- …via dimensions decrease to below 0.15 micrometer with no… --.

Column 6,
Line 1, reads "…and substrate-to-source distance is adjusted to provide…" and should read -- …and substrate-to-source distance are adjusted to provide… --.
Line 31, reads "…structures, are not agglomerated." and should read -- …structures, is not agglomerated. --.

Column 10,
Line 35, reads "…sealing a substrate within a chamber of an IPVD apparatus…" and should read -- … sealing a substrate within a chamber of an iPVD apparatus … --.
Line 57, reads "…semiconductor features having diameters of 0.15 microns or…" and should read -- … semiconductor features having diameters of 0.15 micron or … --.

Column 13,
Line 34, reads "27. The method in claim 20 wherein: " and should read -- 27. The method of claim 20 wherein: --.

Column 14,
Line 57, reads "…and 20 seconds in duration" and should read -- "…and 20 seconds in duration. --.

UNITED STATES PATENT AND TRADEMARK OFFICE
CERTIFICATE OF CORRECTION

PATENT NO.    : 6,755,945 B2
DATED         : June 29, 2004
INVENTOR(S)   : Yasar et al.

It is certified that error appears in the above-identified patent and that said Letters Patent is hereby corrected as shown below:

<u>Column 15,</u>
Line 1, reads "...without opening the chamber; " and should read -- ... without opening the chamber: --.
Line 15, reads "...ionizing in the space, with the plasma energized by RF..." and should read -- ... ionizing in the space, with a plasma energized by RF ... --.

Signed and Sealed this

Twentieth Day of September, 2005

JON W. DUDAS
*Director of the United States Patent and Trademark Office*